United States Patent [19]
Mariani

[11] Patent Number: 5,289,073
[45] Date of Patent: Feb. 22, 1994

[54] UNIDIRECTIONAL SURFACE ACOUSTIC WAVE TRANSDUCER

[75] Inventor: Elio A. Mariani, Hamilton Square, N.J.

[73] Assignee: The United States of America as represented by the Secretary of the Army, Washington, D.C.

[21] Appl. No.: 973,346

[22] Filed: Nov. 9, 1992

[51] Int. Cl.$^5$ ................................. H01L 41/08
[52] U.S. Cl. .......................... 310/313 D; 310/313 B; 333/193; 333/196
[58] Field of Search ........... 310/313 B, 313 C, 313 D; 333/150–154, 193, 194, 195, 196

[56] References Cited

U.S. PATENT DOCUMENTS

| | | | |
|---|---|---|---|
| 4,600,905 | 7/1986 | Fredricksen | 333/196 |
| 4,635,008 | 1/1987 | Solie | 310/313 D X |
| 4,746,882 | 5/1988 | Solie | 333/196 |
| 4,878,036 | 10/1989 | Yatsuda et al. | 333/195 |
| 4,908,542 | 3/1990 | Solie | 310/313 B |
| 4,973,875 | 11/1990 | Yatsuda | 310/313 D |
| 5,075,652 | 12/1991 | Sugai | 333/193 |

OTHER PUBLICATIONS

A. P. van den Heuvel, "Properties of Tapered Surface Wave Transducers," *ECOM Research and Development Technical Report*, Technical Report ECOM-0197-F, pp. 12–14, 18, 19, 22–25, Feb. 1973.

*Primary Examiner*—Mark O. Budd
*Attorney, Agent, or Firm*—Michael Zelenka; Wiliam H. Anderson

[57] ABSTRACT

A low-loss, wideband SAW transducer operating on a piezoelectric substrate with a longitudinal axis of propagation. The SAW transducer has a plurality of tapered interdigital electrodes that are mounted on the substrate transverse to the propagation axis. The electrode widths and spacings are constant along lines parallel to the axis and are tapered in the direction transverse to the axis. An acoustic-wave reflector having a plurality of elongated, tapered discontinuities or reflective fingers is located on the substrate adjacent one end of the transducer. The spacings and widths of the reflective fingers are similar to those of the electrodes, i.e., the finger widths and spacings are tapered in the direction transverse to the axis and are constant along lines parallel to the axis. Because of the taper, the fingers reflect wideband acoustic waves parallel to the axis.

5 Claims, 3 Drawing Sheets

UNIDIRECTIONAL SURFACE ACOUSTIC WAVE TRANSDUCER

GOVERNMENT INTEREST

The invention described herein may be manufactured, used and licensed by or for the Government for governmental purposes without the payment to me of any royalties thereon.

BACKGROUND OF THE INVENTION

1. Field of the Invention

This invention relates to the field of acoustoelectronics. More particularly, the invention relates to a surface acoustic wave (SAW) structure capable of low-loss operation over a relatively wide bandwidth.

2. Description of the Prior Art

In the field of electronics, SAW devices are used in a number of well known signal-processing applications such as signal delay, filtering, signal generation, etc. Generally, SAW devices take advantage of the five-orders-of-magnitude reduction in signal propagation velocity achieved by converting a radio frequency (rf) electromagnetic signal into a surface acoustic wave for propagation in a rigid solid.

In a typical SAW application, an rf signal is first converted by an input transducer into an acoustic surface wave that is confined to the surface of a piezoelectric substrate. The acoustic wave is then coupled to an output transducer for conversion to an electrical signal. These transducers usually consist of thin-film metallic electrode structures deposited on the substrate surface. One common transducer structure comprises an array of interdigital electrodes. The width and spacing of the electrodes are factors that help determine the frequency response of the SAW device and its operation as a signal processor.

Conventional SAW interdigital transducers are bidirectional in that the acoustic energy is transmitted in both the forward and backward directions. However, when a conventional SAW transducer with periodic, parallel electrodes incorporates a properly spaced reflective grating (see FIG. 1), the result is a narrowband, unidirectional structure.

One prior art technique for increasing the bandwidth of conventional interdigital SAW structures consists of tapering the electrode width and spacing (see FIG. 2—it is noted that the tapering angles in FIGS. 2, 3 are greatly exaggerated for clarity). The transducer electrodes are slightly rotated at progressively greater angles with respect to the direction of propagation of the acoustic wave. The electrode tapering and its rotation produces a variable electrode spacing parallel to the propagation path. Consequently, the frequency response, which is a function of electrode spacing, will vary along different but parallel paths across the SAW transducer thereby creating a wideband frequency response. This technique is analyzed in detail in the following report: A. P. van den Heuvel, "Properties of Tapered Surface Wave Transducers," *ECOM Research and Development Technical Report*, Technical Report ECOM-0197-F, pp. 12-14, 18, 19, 22-25, February 1973.

SUMMARY OF THE INVENTION

The general purpose of this invention is to provide a low-loss, wideband SAW structure. To attain this, the present invention contemplates a unique tapered SAW transducer with unidirectional properties. The SAW transducer configuration of the present invention may be used in a variety of SAW filters and signal processors where low insertion loss is important.

Broadly, the present invention is directed to a SAW structure having a piezoelectric substrate with a desired axis of propagation. A SAW transducer has a plurality of interdigital electrodes that are aligned on the substrate transverse to that axis. The electrode spacing on one side of the axis is different from the electrode spacing on the other side of the axis. An acoustic-wave reflector is positioned adjacent one end of the transducer for reflecting acoustic waves propagating parallel to the axis. The reflector is positioned such that the reflected and non-reflected waves add constructively.

More specifically, the invention is for a low-loss, moderately wideband SAW transducer having a tapered geometry. The SAW transducer includes a plurality of tapered interdigital electrodes that are mounted on a piezoelectric substrate transverse to a desired axis of propagation. The electrode spacing is constant along lines parallel to the axis and is tapered in the direction transverse to the axis. Also mounted on the substrate is an acoustic-wave reflector that has a plurality of elongated, tapered discontinuities, referred to herein as reflector fingers. The reflector is mounted adjacent one end of the transducer. The spacing between the reflector fingers is similar to that of the transducer electrodes, i.e., the finger widths and spacings are tapered in the direction transverse to the axis and are constant along lines parallel to the axis. Because of the variable width and spacing, the reflector fingers reflect acoustic waves that are propagating in a direction that has a component parallel to the axis.

The exact nature of this invention as well as other objects and advantages thereof will be readily apparent from consideration of the following specification relating to the annexed drawing.

DETAILED DESCRIPTION OF THE PREFERRED EMBODIMENT

Figure 1:
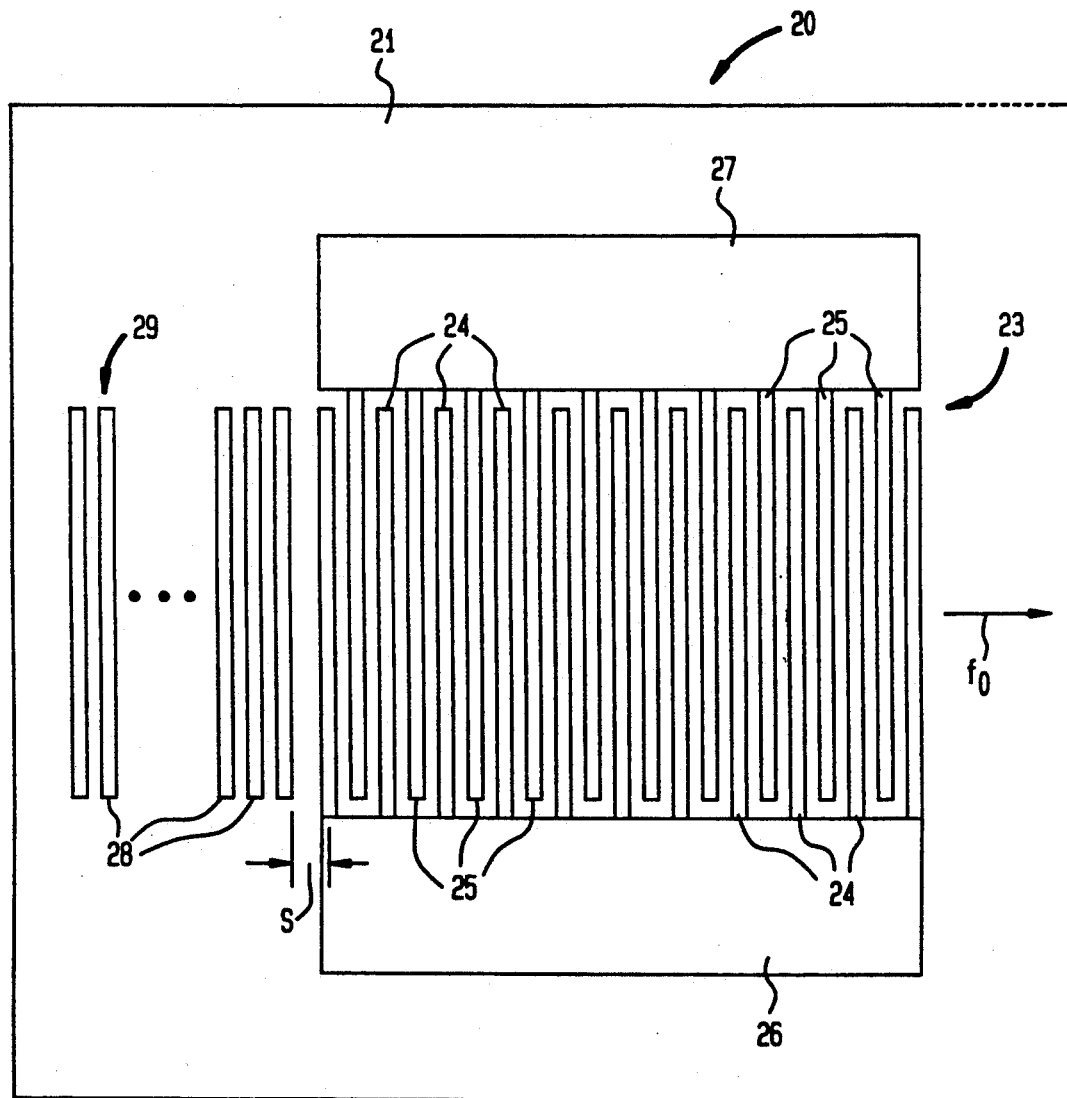
FIG. 1 is a top plan view of a prior art SAW structure with a conventional reflective grating.

Referring now to the drawings, there is shown in FIG. 1 a prior art unidirectional SAW structure 20 comprising a piezoelectric substrate 21 and an interdigital transducer 23 that is positioned on the upper surface of substrate 21. Transducer 23 has two sets of interdigital, quarter-wave electrodes 24, 25 that are parallel to each other. Transducer 23 also includes a pair of bus bars 26, 27 which are also mounted on the upper surface of substrate 21. Bars 26, 27 are elongated conductors that lie parallel to each other. Bus bar 26 is connected to one end of each of electrodes 24. In a symmetric manner, bus bar 27 is connected to one end of each of electrodes 25. In a manner well known to those skilled in these arts, electrical energy is inputted to or outputted from transducer 23 via conductors (not shown) that are connected to bars 26, 27. Electrodes 24, 25 are spaced a distance equal to $\lambda_0/4$, where $\lambda_0$ is the acoustic wavelength corresponding to the center frequency $f_0$ of a relatively narrow operating band; electrodes 24, 25 have widths that are also equal to $\lambda_0/4$.

A reflective grating 29 is mounted in tandem with transducer 23 on substrate 21. Reflective grating 29 includes a plurality of reflective fingers 28 that are arranged parallel to electrodes 24, 25. Fingers 28 function as reflective discontinuities that each produce small, properly phased reflections of acoustic energy propagating on the surface of substrate 21.

A number of structurally different elements may be used as reflective fingers 28, but they are usually formed as thin-film, metallic quarter-wave electrodes, similar to electrodes 24, 25. However, reflective fingers 28 can also be fabricated as dielectric strips that are mounted on the substrate surface or as grooves that are etched into the substrate surface.

The small reflections from each of the reflective fingers 28 add constructively over a narrow frequency range to provide near total reflection of the incident acoustic waves that are traveling in the backward direction, i.e., to the left in FIG. 1. The adjacent edges of grating 29 and transducer 23 are spaced a distance (s) which is optimized to insure that the reflected acoustic waves will constructively add to those waves traveling in the forward direction. The number of reflective fingers 28 is usually large compared to the number of transducer electrodes 24, 25. Because of the reflective grating 29, SAW structure 20 has narrowband, unidirectional properties as indicated by the arrow $f_0$.

Figure 2:
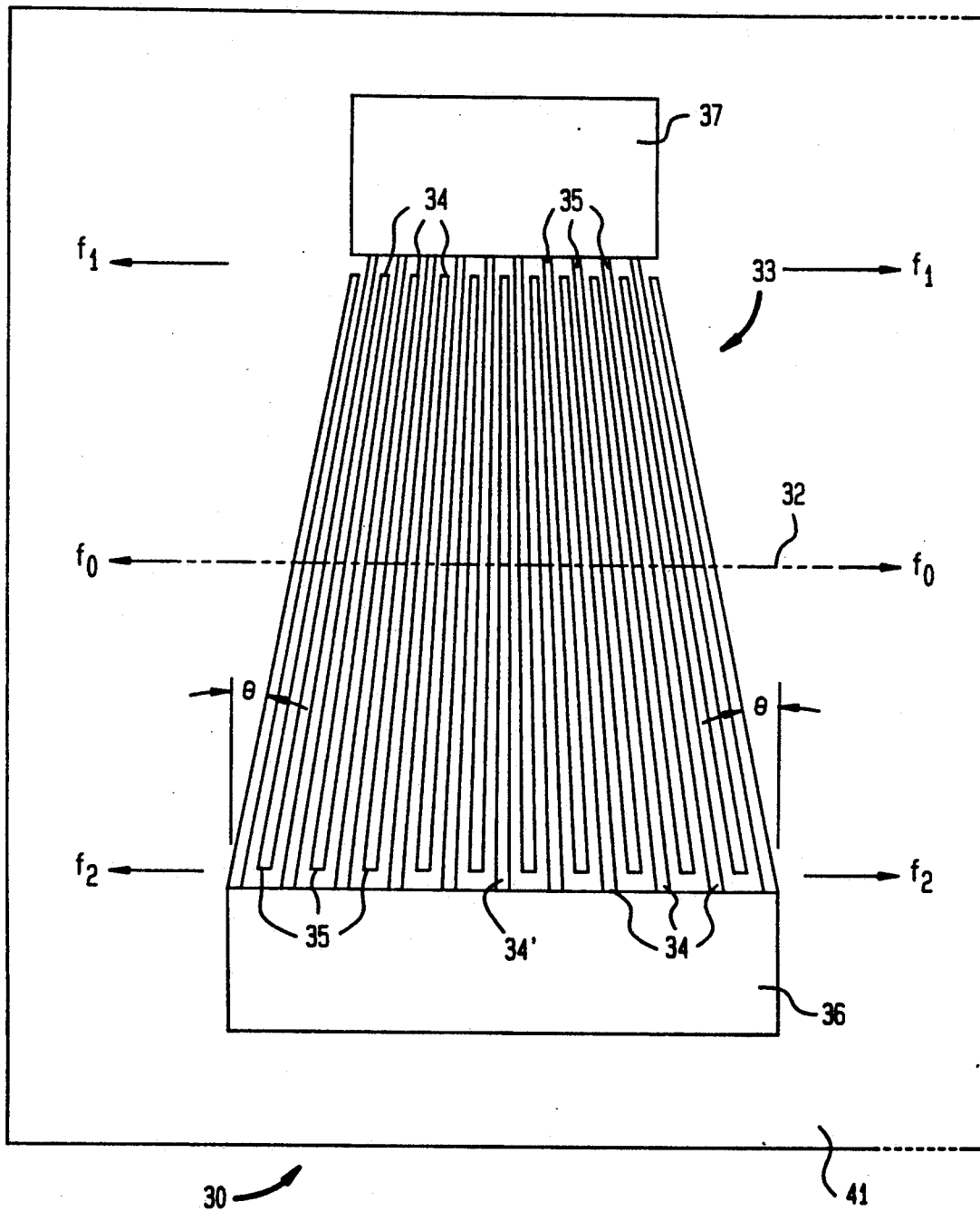
FIG. 2 is a top plan view of another prior art SAW structure with a tapered transducer.

Referring now to FIG. 2, there is shown a prior art wideband SAW structure 30 having a piezoelectric substrate 31. A longitudinal axis 32, or axis of propagation, is shown as passing through the center of the structure 30.

Structure 30 also includes a tapered interdigital transducer 33 that is mounted on the upper surface of substrate 31. Transducer 33 has two sets of interdigital, quarter-wave electrodes 34, 35 that extend transverse to axis 32. Transducer 33 further includes a pair of bus bars 36, 37 that are also mounted on the surface of substrate 31. Bars 36, 37 are elongated conductors that lie parallel to and on opposite sides of axis 32. Bus bar 36 is connected to one end of each of electrodes 34. In a symmetric manner, bus bar 37 is connected to one end of each of electrodes 35.

The middle electrode of the set of electrodes 34, 35, designated here as electrode 34', is perpendicular to axis 32. The remaining electrodes 34, 35 are rotated slightly at progressively greater angles to a maximum angle $\Theta$. The rotation of electrodes 34, 35 is such that the longitudinal spacing between electrodes 34, 35 is constant along any line parallel to axis 32. Also, the width of and spacing between electrodes 34, 35 increases uniformly in the transverse direction from bar 37 to bar 36. As such, the width of and spacing between electrodes 34, 35 in the region adjacent bar 36 are constant and a maximum; in the region of bar 37 they are constant and a minimum.

Because the frequency response of an interdigital transducer, such as transducer 33, is a function of the electrode spacing and because the electrode spacing in a tapered transducer, such as transducer 33, varies transversely with respect to the axis of propagation, such as axis 32, the frequency response also varies transversely. Frequencies generated by SAW structure 30 is depicted in FIG. 2 with arrows $f_0$, $f_1$, $f_2$, which represent the center-band, upper-band-edge and lower-band-edge frequencies, respectively. In this regard, the bandwidth $\Delta f$ of transducer 33 is equal to $(f_1-f_2)$ which is equal to the difference in the frequencies corresponding to the different spacing of electrodes 34, 35 at opposite ends of the taper. In practice, a fractional bandwidth, $\Delta f/f_0$, of 0.1 for this type of transducer structure is routine.

The maximum angle $\Theta$ is usually in the order of about two degrees and does not contribute significantly to direct walk-off of acoustic energy. The potential walk-off problem is further minimized if the input and output transducers in a SAW device are close (i.e., transducer 33 is close to its mate which is not shown), as is normally the case for most SAW filters.

As is well known and discussed in van de Heuvel, supra, angle $\Theta$ is dependent only on the number (M) of lobes in the corresponding sin x/x time domain response and the normalized acoustic aperture (W) (see FIG. 2). Angle $\Theta$ is independent of the number of electrodes 34, 35, center frequency $f_0$, or bandwidth $(f_1-f_2)$. Assuming that a total of five lobes (M=5) of the waveform envelope are adequate, then the value of $\Theta$ for typical acoustic apertures (W) of $50\lambda_0$ to between $100\lambda_0$ lies between 3.4 and 1.7 degrees.

It is noted that SAW structure 30 is bidirectional, permitting acoustic energy to propagate in both the forward and backward directions. The energy propagated in one of these directions will be lost through absorption. For the FIG. 2 embodiment, the mate transducer (not shown) is assumed to be to the right; as such, acoustic energy transmitted by SAW structure 30 to the left away from the mate transducer will be lost. As noted above, this lost energy will contribute an insertion loss of 3dB.

Figure 3:
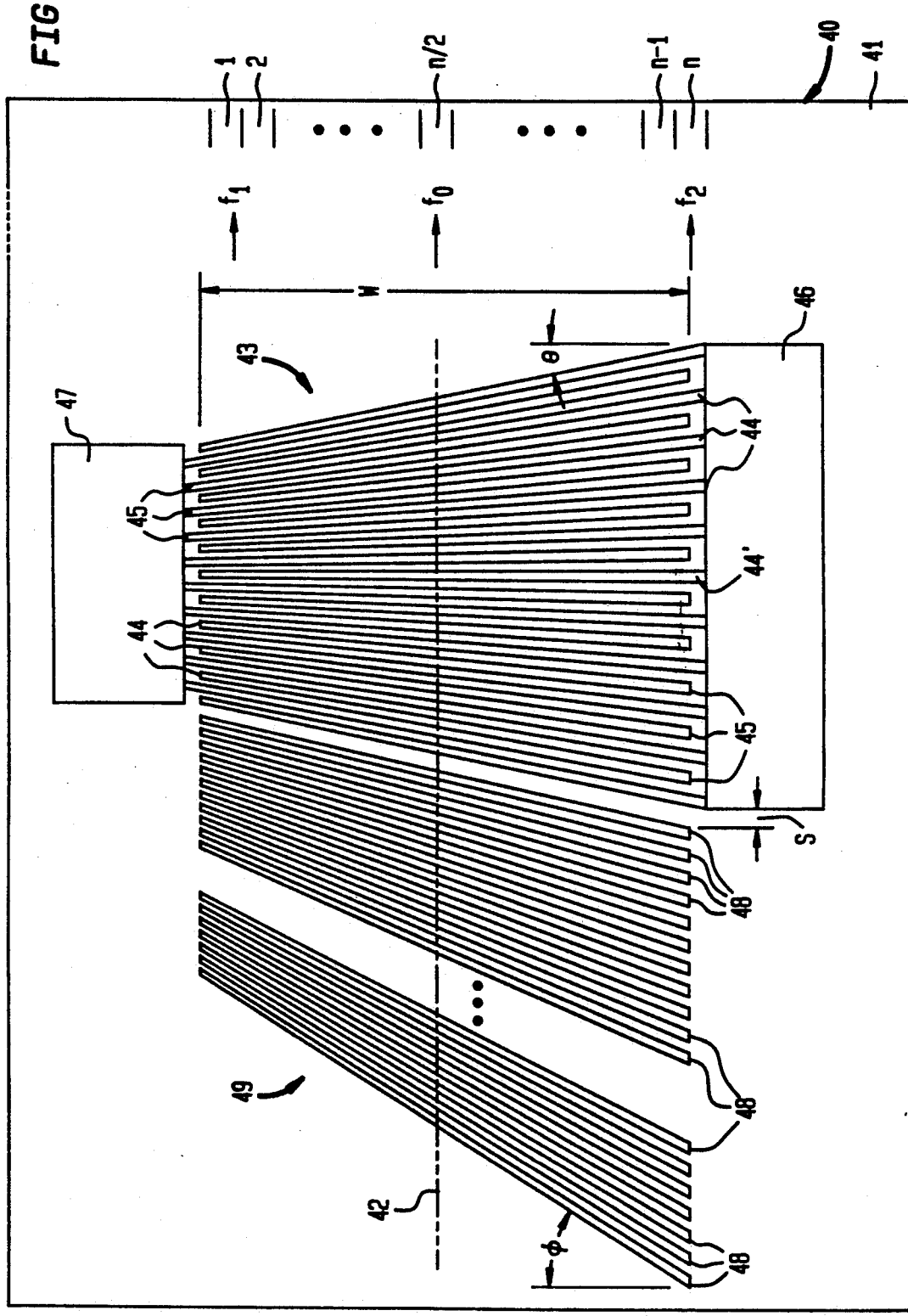
FIG. 3 is a top plan view of the preferred embodiment.

The preferred embodiment of FIG. 3 shows a low-loss, wideband SAW structure 40 having a piezoelectric substrate 41. A longitudinal propagation axis 42 passes through the center.

Saw structure 40 also includes a tapered interdigital transducer 43 and a tapered reflective grating 49 that are mounted in tandem on substrate 41. Transducer 43, constructed similarly to transducer 33, has two sets of interdigital, quarter-wave electrodes 44, 45 that extend transverse to axis 42. Transducer 43 includes a pair of elongated bus bars 46, 47 which are also mounted on the surface of substrate 41 and lie parallel to and on opposite sides of axis 42. Bus bar 46 is connected to one end of each of electrodes 44. In a symmetric manner, bus bar 47 is connected to one end of each of electrodes 45.

The middle electrode 44' of the set of electrodes 44, 45, is perpendicular to axis 42. The remaining electrodes 44, 45 are slightly rotated at progressively greater angles to a maximum angle $\Theta$ in the same manner as described above with respect to electrodes 34, 35 of FIG. 2.

The width and spacing of electrodes 44, 45 are tapered. The longitudinal spacing between electrodes 44, 45 is constant along any line parallel to axis 42. The tapered widths and spacings of electrodes 44, 45 increase uniformly in the transverse direction as you move from bar 47 to bar 46, making these dimensions in the region adjacent bar 46 a constant and a maximum, and in the region of bar 47 a constant and a minimum.

Reflective grating 49 includes a plurality of spaced reflective fingers 48 that are arranged transverse to axis 42. Fingers 48 are constructed as reflective discontinuities that each produce small reflections in a manner similar to reflective fingers 28 of FIG. 1. Assuming that reflective fingers 48 are electrodes similar to electrodes 44, 45, the finger taper and spacing are similar to that of electrodes 44, 45. The angular variation of reflective fingers 48 has the same periodicity as the angular variation of electrodes 44, 45. As with SAW structure 20 of FIG. 1, the separation (s) between grating 49 and transducer 43 is chosen to achieve the proper phase coherence between incident and reflected waves.

Tapered transducer 43 in combination with a properly spaced tapered reflective grating 49 provides unidirectional performance with relatively wideband characteristics. Transducer operation can be analyzed by viewing tapered transducer 43 and grating 49 as defining a number (n) (see FIG. 3) of narrowband, unidirectional sections that are adjacent and parallel to each other and parallel to axis 42. Each section can be viewed as having a bandwidth equal to 1/n times the total transducer bandwidth $\Delta f=(f_1-f_2)$. For example, the first section has a bandwidth $(f_1-f_2)/n$ with center frequency $f_1$; section n/2 has the same bandwidth with center frequency $f_0$; section (n) also has the same bandwidth with a center frequency of $f_2$; and so forth. To analyze a typical example, assume SAW structure 40 has a fractional bandwidth of 0.1, i.e., $\Delta f/f_0=0.1$, with the following characteristics: the number (N) of electrode pairs of electrodes 44, 45 is equal to 60; maximum angle $\Theta$ is equal to 1.7 degrees; and the transducer aperture (W) is $100\lambda_0$, where $\lambda_0$ is the acoustic wavelength associated with the center frequency $f_0$. If it is assumed further that the transducer 43 is partitioned into ten sections (i.e., n=10), each parallel section corresponds to a narrowband transducer with a fractional bandwidth of 0.01, a value that is commonly found in conventional unidirectional transducers (see FIG. 1). These (n) adjacent narrowband sections together form a wideband transducer having a bandwidth $(f_1-f_2)$ that is equal to the sum of the individual narrowband sections.

The angular tapering of reflective fingers 48 increases from angle $\Theta$ to an angle $\phi$ the value of which depends on the number of reflective fingers 48. To ensure effective reflection from even the most remote finger 48, angle $\phi$ cannot be too large. The following calculations illustrate typical values for a reasonable implementation. It is known that the fractional bandwidth is given by the following expression:

$$\frac{\Delta f}{f_0} = \frac{M+1}{N} \quad (1)$$

where: $\Delta f$ is the bandwidth $(f_1-f_2)$; $f_0$ is the center frequency; (M) is the number of lobes in the truncated sin x/x time domain response; and (N) is the number of electrode pairs of electrodes 44, 45. Assuming that the fractional bandwidth is 0.1 and that five lobes are sufficient (M=5), then using Equation (1) the number (N) of electrode pairs is determined from:

$$\frac{\Delta f}{f_0} = 0.1 = \frac{5+1}{N}, \quad (2)$$

and solving for (N) in Equation (2)

$$N = \frac{5+1}{0.1} = 60. \quad (3)$$

It is also known that angle $\Theta$ is given by the following expression:

$$\Theta = \frac{M+1}{2\alpha}, \quad (4)$$

where $\alpha$ is defined as follows:

$$\alpha = \frac{W}{\lambda_0}. \quad (5)$$

From Equations (4) and (5), a specific value for angle $\Theta$ is calculated using typical values as follows:

$$\Theta = \frac{5+1}{2(W/\lambda_0)} = \frac{3}{(100\lambda_0/\lambda_0)} = 0.03 \text{ rad} = 1.7°. \quad (6)$$

In the above calculation, acoustic aperture (W) is $100\lambda_0$ and the number (M) of lobes is five. With the number of reflective fingers 48 in the order of ten times the number (N) and angle $\Theta=1.7$ degrees, angle $\phi$ will in some applications be too large. As such, it is often desirable to reduce angle $\phi$ to obtain effective reflection. Angle $\phi$ may be readily reduced by reducing angle $\Theta$. To reduce angle $\Theta$ and thereby reduce angle $\phi$, the size of acoustic aperture (W) may be increased. Increasing aperture (W) from, for example, $100\lambda_0$ to $150\lambda_0$ decreases angle $\Theta$ from 1.7 to 1.2 degrees (see Equation 6). In turn, the size of angle $\phi$ will be decreased, thereby improving the performance of grating 49.

Obviously many modifications and variations are possible in the light of the above teachings. It is therefore to be understood that the invention should not be limited to the exact details of construction shown and described because other modifications will occur to a person skilled in the art.

What is claimed is:

1. A SAW structure comprising:
   a piezoelectric substrate having an axis of propagation;
   a SAW transducer having a plurality of interdigital, quarter-wave electrodes mounted on the substrate transverse to the axis with an electrode spacing on one side of the axis being different from an electrode spacing on the other side of the axis, the widths of and spacing between the electrodes tapering in a direction transverse to the axis, and wherein the transducer includes a first and a second bus bars connected to alternate ones of the interdigital electrodes; and
   acoustic-wave reflector means mounted on the substrate adjacent one end of the transducer for reflecting acoustic waves propagating on the substrate in a first direction which is transverse to the electrodes to a second direction which is substantially opposite to the first direction, wherein the acoustic-wave reflector means includes a discontinuity grating which is aligned on the substrate transverse to the axis and such that surface acoustic waves reflected by the reflector means constructively add to acoustic waves propagating on the substrate in the second direction and wherein said discontinuity grating has spaced reflective fingers having spacings that are different on opposite sides of the axis.

2. The SAW structure of claim 1 wherein said spacings of said fingers taper in a direction transverse to said axis.

3. The SAW structure of claim 2 wherein said electrode spacing and said finger spacing are substantially one-quarter the acoustic wavelength of incident waves propagating parallel to said axis.

4. A SAW structure comprising:
a piezoelectric substrate having an axis of propagation;
a tapered SAW transducer having a plurality of interdigital, quarter-wave electrodes mounted on the substrate transverse to the axis with the width and spacing of the electrodes tapered, the transducer including a first and a second bus bars connected to alternate ones of the interdigital electrodes; and
acoustic-wave reflector means mounted on the substrate adjacent one end of the transducer for reflecting acoustic waves propagating on the substrate in a first direction, which is transverse to the electrodes, to a second direction, which is substantially opposite to the first direction, wherein the acoustic-wave reflector means includes a discontinuity grating which is aligned on the substrate transverse to the axis and such that surface acoustic waves reflected thereby constructively add to acoustic waves propagating on the substrate in the second direction and wherein said discontinuity grating has spaced reflective fingers having tapered widths and spacings.

5. The SAW structure of claim 4 wherein the spacings of said electrodes and said fingers are substantially one-quarter the acoustic wavelength of incident waves propagating parallel to said axis.

* * * * *